(12) United States Patent
Das et al.

(10) Patent No.: US 11,255,892 B2
(45) Date of Patent: Feb. 22, 2022

(54) PHASE COMPENSATION IN A RESONANT PHASE DETECTOR

(71) Applicant: Cirrus Logic International Semiconductor Ltd., Edinburgh (GB)

(72) Inventors: Tejasvi Das, Austin, TX (US); Siddharth Maru, Austin, TX (US); Xin Zhao, Austin, TX (US); Matthew Beardsworth, Cedar Park, TX (US); Michael A. Kost, Austin, TX (US); John L. Melanson, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 52 days.

(21) Appl. No.: 16/658,755

(22) Filed: Oct. 21, 2019

(65) Prior Publication Data

US 2020/0386804 A1 Dec. 10, 2020

Related U.S. Application Data

(60) Provisional application No. 62/857,384, filed on Jun. 5, 2019.

(51) Int. Cl.
*G01R 29/18* (2006.01)

(52) U.S. Cl.
CPC .................. *G01R 29/18* (2013.01)

(58) Field of Classification Search
None
See application file for complete search history.

(56) References Cited

U.S. PATENT DOCUMENTS

| | | | | |
|---|---|---|---|---|
| 5,287,065 A | * | 2/1994 | Allfather | G01R 17/06 324/651 |
| 5,657,238 A | * | 8/1997 | Lindeboom | G01K 7/24 702/65 |
| 7,719,241 B2 | * | 5/2010 | Dean | G05F 1/46 323/273 |
| 2009/0140728 A1 | * | 6/2009 | Rollins | G01B 7/023 324/207.16 |
| 2009/0302868 A1 | * | 12/2009 | Feucht | G01D 5/2013 324/654 |
| 2012/0218001 A1 | * | 8/2012 | Leibowitz | H03L 7/08 327/9 |
| 2014/0091811 A1 | * | 4/2014 | Potyrailo | G06K 19/0723 324/602 |

(Continued)

OTHER PUBLICATIONS

Lewis GK Jr, Lewis GK Sr, Olbricht W. Cost-effective broad-band electrical impedance spectroscopy measurement circuit and signal analysis for piezo-materials and ultrasound transducers. Meas Sci Technol. 2008;19(10):105102. doi:10.1088/0957-0233/19/10. (Year: 2008).*

*Primary Examiner* — Eman A Alkafawi
*Assistant Examiner* — Denise R Karavias
(74) *Attorney, Agent, or Firm* — Jackson Walker L.L.P.

(57) ABSTRACT

A system may include a sensor having a variable phase response, a dummy impedance having a known phase response, and a measurement circuit communicatively coupled to the sensor and configured to measure first phase information associated with the sensor, measure second phase information associated with the dummy impedance, and determine a phase response of the measurement circuit based on a comparison of the first phase information to the second phase information.

34 Claims, 5 Drawing Sheets

(56) References Cited

U.S. PATENT DOCUMENTS

| | | | |
|---|---|---|---|
| 2014/0111226 A1* | 4/2014 | Lamesch | G01D 5/24 |
| | | | 324/679 |
| 2017/0185173 A1* | 6/2017 | Ito | G06F 3/03545 |
| 2017/0336469 A1* | 11/2017 | Lam | G01R 31/2829 |
| 2018/0172612 A1* | 6/2018 | Lipowitz | G01N 27/026 |
| 2021/0285996 A1* | 9/2021 | Van Ostrand | H03F 3/45475 |

* cited by examiner

PHASE COMPENSATION IN A RESONANT PHASE DETECTOR

RELATED APPLICATION

The present disclosure claims priority to U.S. Provisional Patent Application Ser. No. 62/857,384, filed Jun. 5, 2019, which is incorporated by reference herein in its entirety.

FIELD OF DISCLOSURE

The present disclosure relates in general to electronic devices with user interfaces, (e.g., mobile devices, game controllers, instrument panels for vehicles, machinery, and/or appliances, etc.), and more particularly, resonant phase sensing of resistive-inductive-capacitive sensors for use in a system for mechanical button replacement in a mobile device, and/or other suitable applications.

BACKGROUND

Many traditional mobile devices (e.g., mobile phones, personal digital assistants, video game controllers, etc.) include mechanical buttons to allow for interaction between a user of a mobile device and the mobile device itself. However, such mechanical buttons are susceptible to aging, wear, and tear that may reduce the useful life of a mobile device and/or may require significant repair if malfunction occurs. Also, the presence of mechanical buttons may render it difficult to manufacture mobile devices that are waterproof. Accordingly, mobile device manufacturers are increasingly looking to equip mobile devices with virtual buttons that act as a human-machine interface allowing for interaction between a user of a mobile device and the mobile device itself. Similarly, mobile device manufacturers are increasingly looking to equip mobile devices with other virtual interface areas (e.g., a virtual slider, interface areas of a body of the mobile device other than a touch screen, etc.). Ideally, for best user experience, such virtual interface areas should look and feel to a user as if a mechanical button or other mechanical interface were present instead of a virtual button or virtual interface area.

Presently, linear resonant actuators (LRAs) and other vibrational actuators (e.g., rotational actuators, vibrating motors, etc.) are increasingly being used in mobile devices to generate vibrational feedback in response to user interaction with human-machine interfaces of such devices. Typically, a sensor (traditionally a force or pressure sensor) detects user interaction with the device (e.g., a finger press on a virtual button of the device) and in response thereto, the linear resonant actuator may vibrate to provide feedback to the user. For example, a linear resonant actuator may vibrate in response to user interaction with the human-machine interface to mimic to the user the feel of a mechanical button click.

However, there is a need in the industry for sensors to detect user interaction with a human-machine interface, wherein such sensors provide acceptable levels of sensor sensitivity, power consumption, and size.

SUMMARY

In accordance with the teachings of the present disclosure, the disadvantages and problems associated with sensing of human-machine interface interactions in a mobile device may be reduced or eliminated.

In accordance with embodiments of the present disclosure, a system may include a sensor having a variable phase response, a dummy impedance having a known phase response, and a measurement circuit communicatively coupled to the sensor and configured to measure first phase information associated with the sensor, measure second phase information associated with the dummy impedance, and determine a phase response of the measurement circuit based on a comparison of the first phase information to the second phase information.

In accordance with these and other embodiments of the present disclosure, a method may comprise, in a system including a sensor having a variable phase response and a dummy impedance having a known phase response, measuring first phase information associated with the sensor, measuring second phase information associated with the dummy impedance, and determining a phase response of the measurement circuit based on a comparison of the first phase information to the second phase information.

Technical advantages of the present disclosure may be readily apparent to one having ordinary skill in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

Figure 5A:
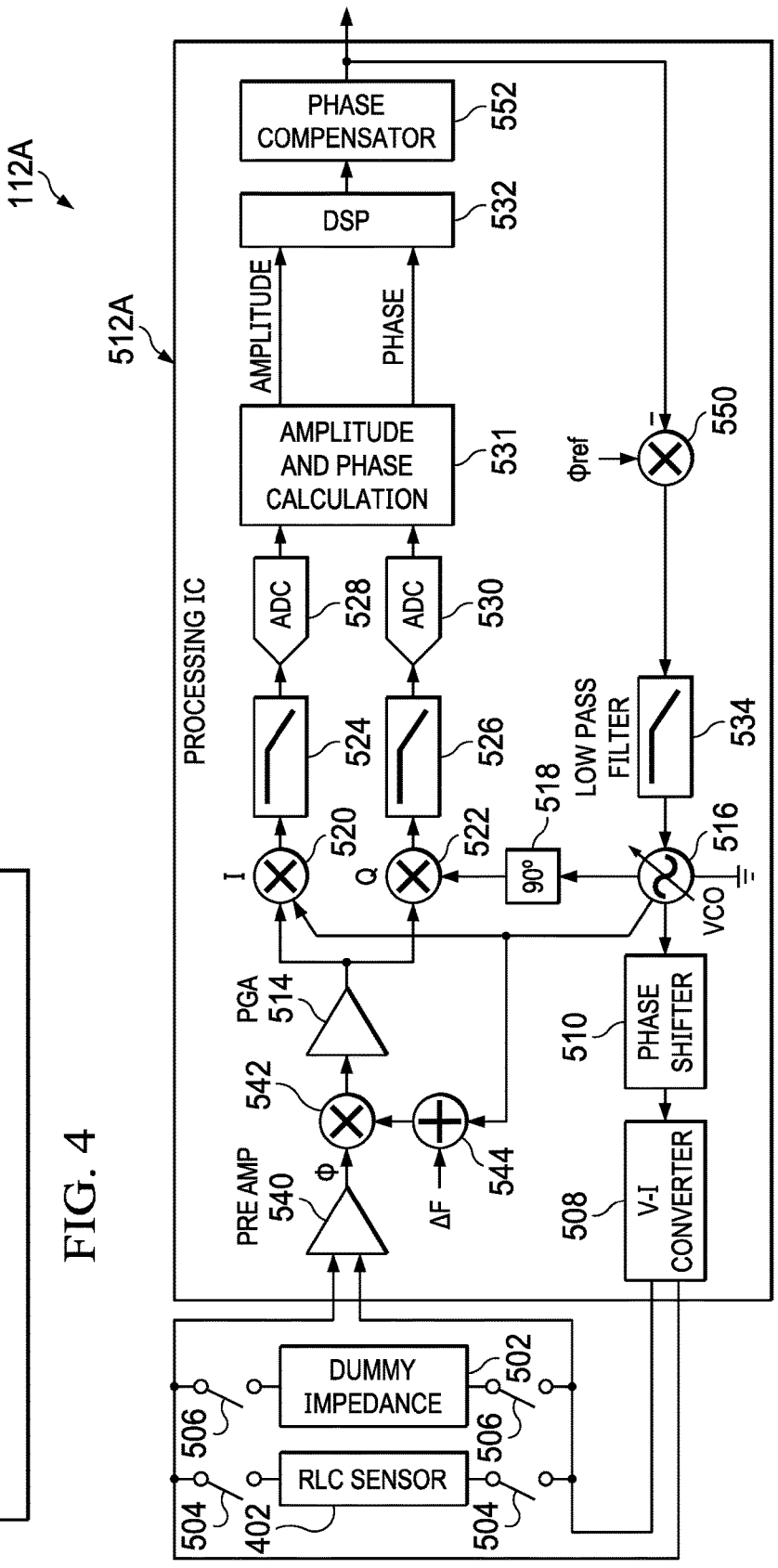
Figure 5B:
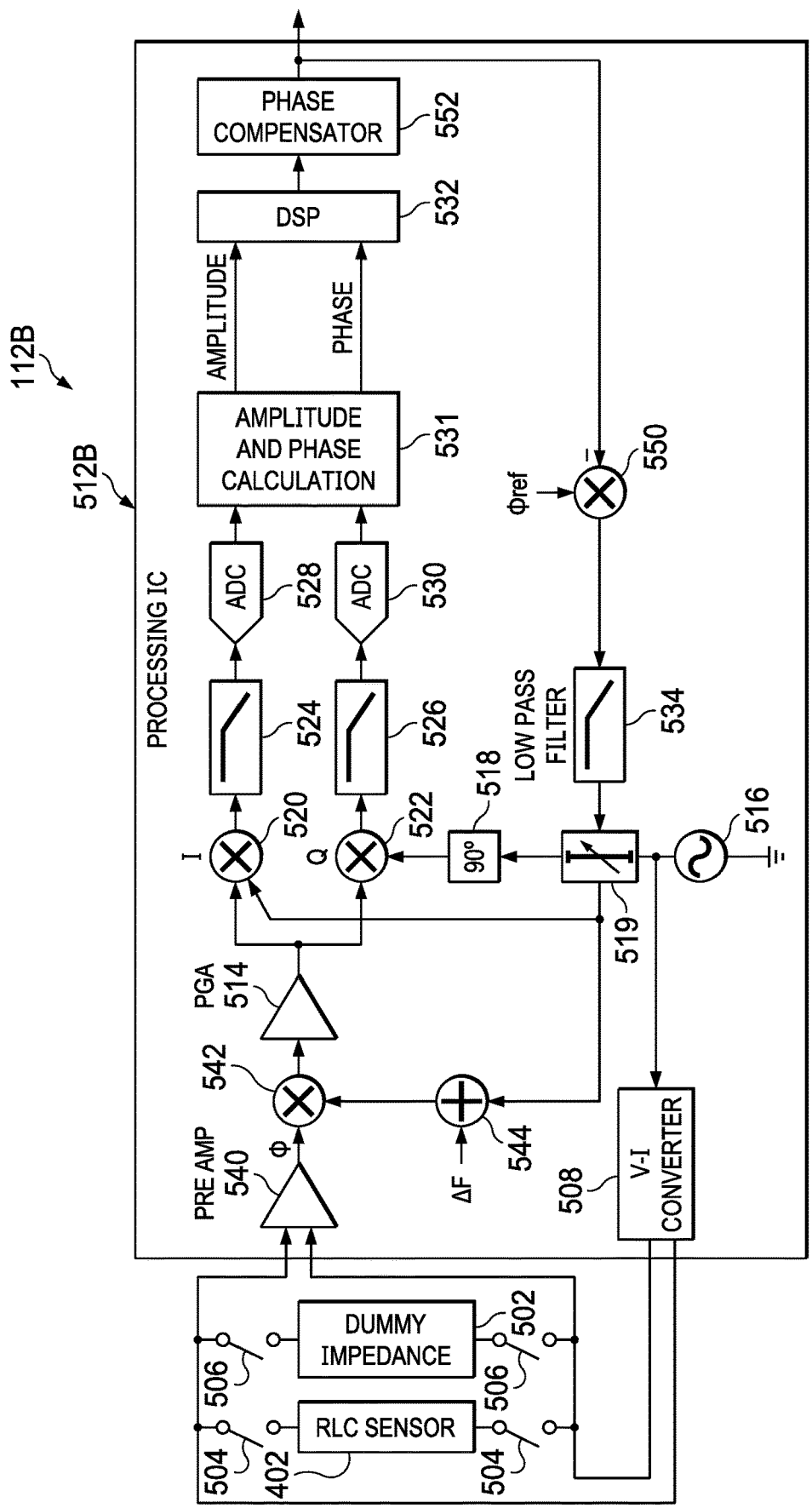
Figure 5C:
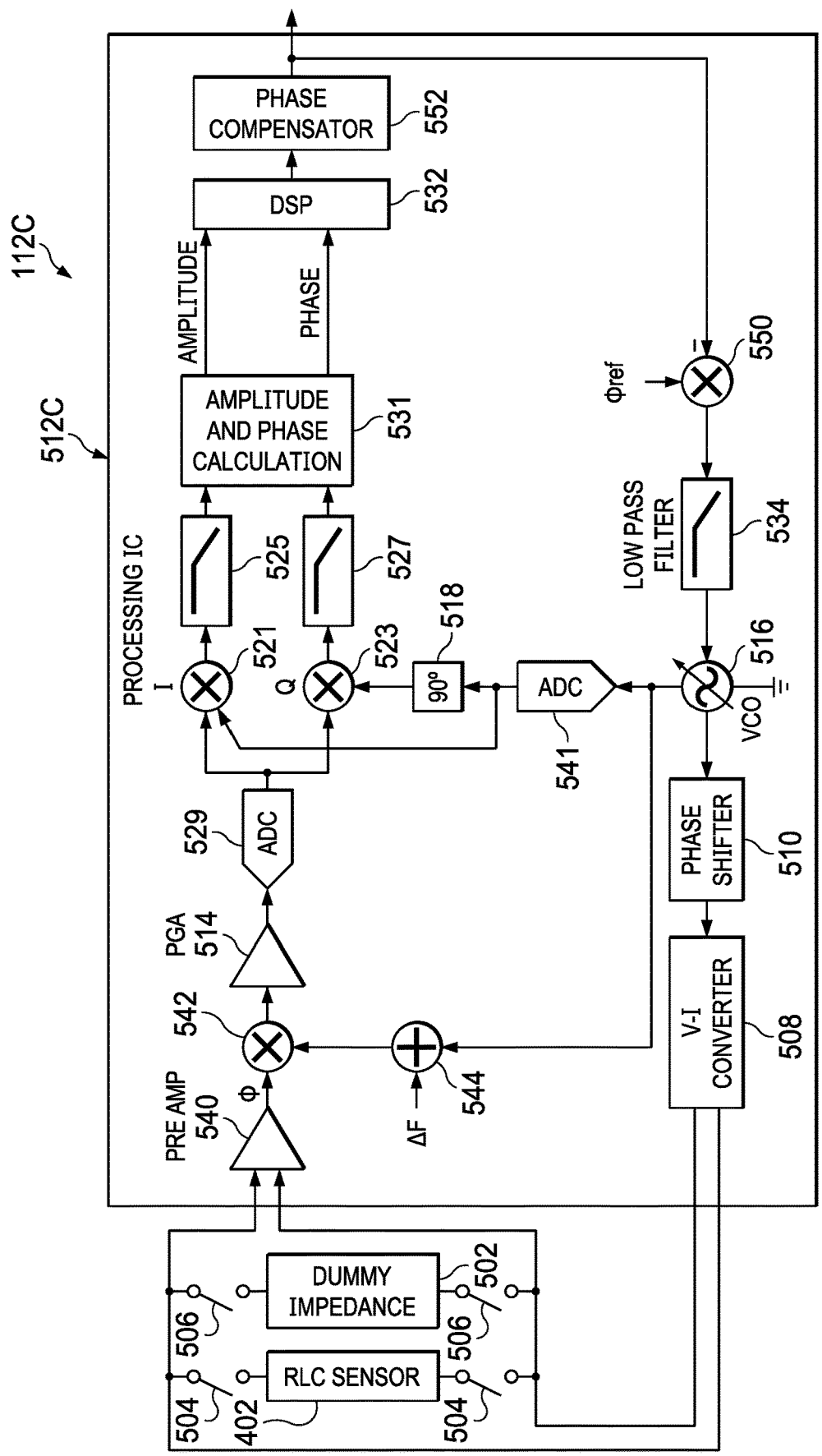
Figure 6A:
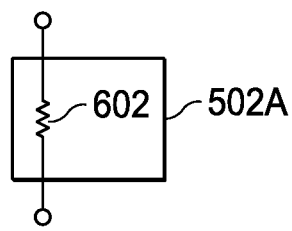
Figure 6B:
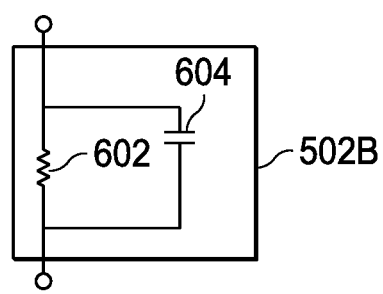

Each of FIGS. 5A-5C illustrates a diagram of selected components of an example resonant phase sensing system, in accordance with embodiments of the present disclosure; and Each of FIGS. 6A and 6B illustrates a diagram of selected components of an example dummy impedance, in accordance with embodiments of the present disclosure.

DETAILED DESCRIPTION

Figure 1:
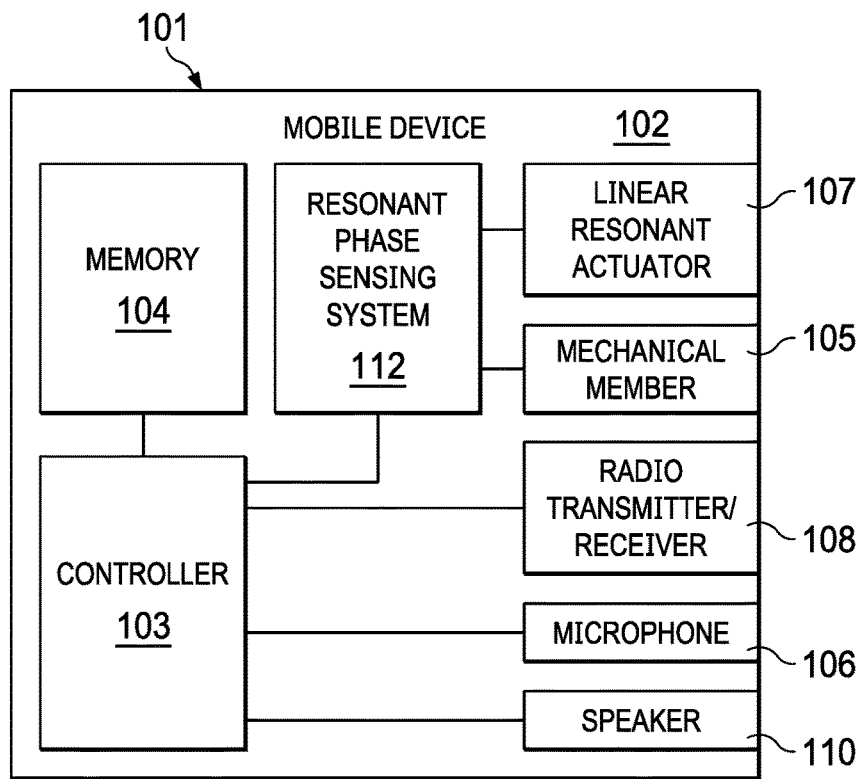
FIG. 1 illustrates a block diagram of selected components of an example mobile device, in accordance with embodiments of the present disclosure.

FIG. 1 illustrates a block diagram of selected components of an example mobile device 102, in accordance with embodiments of the present disclosure. As shown in FIG. 1, mobile device 102 may comprise an enclosure 101, a controller 103, a memory 104, a mechanical member 105, a microphone 106, a linear resonant actuator 107, a radio transmitter/receiver 108, a speaker 110, and a resonant phase sensing system 112.

Enclosure 101 may comprise any suitable housing, casing, or other enclosure for housing the various components of mobile device 102. Enclosure 101 may be constructed from plastic, metal, and/or any other suitable materials. In addition, enclosure 101 may be adapted (e.g., sized and shaped) such that mobile device 102 is readily transported on a person of a user of mobile device 102. Accordingly, mobile device 102 may include but is not limited to a smart phone, a tablet computing device, a handheld computing device, a personal digital assistant, a notebook computer, a video game controller, or any other device that may be readily transported on a person of a user of mobile device 102.

Controller 103 may be housed within enclosure 101 and may include any system, device, or apparatus configured to interpret and/or execute program instructions and/or process data, and may include, without limitation a microprocessor, microcontroller, digital signal processor (DSP), application specific integrated circuit (ASIC), or any other digital or analog circuitry configured to interpret and/or execute program instructions and/or process data. In some embodiments, controller 103 may interpret and/or execute program instructions and/or process data stored in memory 104 and/or other computer-readable media accessible to controller 103.

Memory 104 may be housed within enclosure 101, may be communicatively coupled to controller 103, and may include any system, device, or apparatus configured to retain program instructions and/or data for a period of time (e.g., computer-readable media). Memory 104 may include random access memory (RAM), electrically erasable programmable read-only memory (EEPROM), a Personal Computer Memory Card International Association (PCMCIA) card, flash memory, magnetic storage, opto-magnetic storage, or any suitable selection and/or array of volatile or non-volatile memory that retains data after power to mobile device 102 is turned off.

Microphone 106 may be housed at least partially within enclosure 101, may be communicatively coupled to controller 103, and may comprise any system, device, or apparatus configured to convert sound incident at microphone 106 to an electrical signal that may be processed by controller 103, wherein such sound is converted to an electrical signal using a diaphragm or membrane having an electrical capacitance that varies based on sonic vibrations received at the diaphragm or membrane. Microphone 106 may include an electrostatic microphone, a condenser microphone, an electret microphone, a microelectromechanical systems (MEMs) microphone, or any other suitable capacitive microphone.

Radio transmitter/receiver 108 may be housed within enclosure 101, may be communicatively coupled to controller 103, and may include any system, device, or apparatus configured to, with the aid of an antenna, generate and transmit radio-frequency signals as well as receive radio-frequency signals and convert the information carried by such received signals into a form usable by controller 103. Radio transmitter/receiver 108 may be configured to transmit and/or receive various types of radio-frequency signals, including without limitation, cellular communications (e.g., 2G, 3G, 4G, LTE, etc.), short-range wireless communications (e.g., BLUETOOTH), commercial radio signals, television signals, satellite radio signals (e.g., GPS), Wireless Fidelity, etc.

A speaker 110 may be housed at least partially within enclosure 101 or may be external to enclosure 101, may be communicatively coupled to controller 103, and may comprise any system, device, or apparatus configured to produce sound in response to electrical audio signal input. In some embodiments, a speaker may comprise a dynamic loudspeaker, which employs a lightweight diaphragm mechanically coupled to a rigid frame via a flexible suspension that constrains a voice coil to move axially through a cylindrical magnetic gap. When an electrical signal is applied to the voice coil, a magnetic field is created by the electric current in the voice coil, making it a variable electromagnet. The voice coil and the driver's magnetic system interact, generating a mechanical force that causes the voice coil (and thus, the attached cone) to move back and forth, thereby reproducing sound under the control of the applied electrical signal coming from the amplifier.

Mechanical member 105 may be housed within or upon enclosure 101, and may include any suitable system, device, or apparatus configured such that all or a portion of mechanical member 105 displaces in position responsive to a force, a pressure, or a touch applied upon or proximately to mechanical member 105. In some embodiments, mechanical member 105 may be designed to appear as a mechanical button on the exterior of enclosure 101.

Linear resonant actuator 107 may be housed within enclosure 101, and may include any suitable system, device, or apparatus for producing an oscillating mechanical force across a single axis. For example, in some embodiments, linear resonant actuator 107 may rely on an alternating current voltage to drive a voice coil pressed against a moving mass connected to a spring. When the voice coil is driven at the resonant frequency of the spring, linear resonant actuator 107 may vibrate with a perceptible force. Thus, linear resonant actuator 107 may be useful in haptic applications within a specific frequency range. While, for the purposes of clarity and exposition, this disclosure is described in relation to the use of linear resonant actuator 107, it is understood that any other type or types of vibrational actuators (e.g., eccentric rotating mass actuators) may be used in lieu of or in addition to linear resonant actuator 107. In addition, it is also understood that actuators arranged to produce an oscillating mechanical force across multiple axes may be used in lieu of or in addition to linear resonant actuator 107. As described elsewhere in this disclosure, a linear resonant actuator 107, based on a signal received from resonant phase sensing system 112, may render haptic feedback to a user of mobile device 102 for at least one of mechanical button replacement and capacitive sensor feedback.

Together, mechanical member 105 and linear resonant actuator 107 may form a human-interface device, such as a virtual interface (e.g., a virtual button), which, to a user of mobile device 102, has a look and feel of a mechanical button or other mechanical interface of mobile device 102.

Resonant phase sensing system 112 may be housed within enclosure 101, may be communicatively coupled to mechanical member 105 and linear resonant actuator 107, and may include any system, device, or apparatus configured to detect a displacement of mechanical member 105 indicative of a physical interaction (e.g., by a user of mobile device 102) with the human-machine interface of mobile device 102 (e.g., a force applied by a human finger to a virtual interface of mobile device 102). As described in greater detail below, resonant phase sensing system 112 may detect displacement of mechanical member 105 by performing resonant phase sensing of a resistive-inductive-capacitive sensor for which an impedance (e.g., inductance, capacitance, and/or resistance) of the resistive-inductive-capacitive sensor changes in response to displacement of mechanical member 105. Thus, mechanical member 105 may comprise any suitable system, device, or apparatus which all or a portion thereof may displace, and such displacement may cause a change in an impedance of a resistive-inductive-capacitive sensor integral to resonant phase sensing system 112. Resonant phase sensing system 112 may also generate an electronic signal for driving linear resonant actuator 107 in response to a physical interaction associated with a human-machine interface associated with mechanical member 105. Detail of an example resonant phase sensing system 112 in accordance with embodiments of the present disclosure is depicted in greater detail below.

Although specific example components are depicted in FIG. 1 as being integral to mobile device 102 (e.g., controller 103, memory 104, mechanical member 105, microphone 106, radio transmitter/receiver 108, speakers(s) 110, linear resonant actuator 107, etc.), a mobile device 102 in accordance with this disclosure may comprise one or more components not specifically enumerated above. For example, although FIG. 1 depicts certain user interface components, mobile device 102 may include one or more other user interface components in addition to those depicted in FIG. 1, including but not limited to a keypad, a touch screen, and a display, thus allowing a user to interact with and/or otherwise manipulate mobile device 102 and its associated components. In addition, although FIG. 1 depicts only a single virtual button comprising mechanical member 105 and linear resonant actuator 107 for purposes of clarity and exposition, in some embodiments a mobile device 102 may have multiple virtual interfaces each comprising a respective mechanical member 105 and linear resonant actuator 107.

Although, as stated above, resonant phase sensing system 112 may detect displacement of mechanical member 105 by performing resonant phase sensing of a resistive-inductive-capacitive sensor for which an impedance (e.g., inductance, capacitance, and/or resistance) of the resistive-inductive-capacitive sensor changes in response to displacement of mechanical member 105, in some embodiments resonant phase sensing system 112 may primarily detect displacement of mechanical member 105 by using resonant phase sensing to determine a change in an inductance of a resistive-inductive-capacitive sensor. For example, FIGS. 2 and 3 illustrate selected components of an example inductive sensing application that may be implemented by resonant phase sensing system 112, in accordance with embodiments of the present disclosure.

Although the foregoing contemplates a resonant phase sensing system 112 for use in a mobile device 102, the resonant phase sensing system 112 may be used in any other suitable host device. A host device may include without limitation, a portable and/or battery-powered mobile computing device (e.g., a laptop, notebook, or tablet computer), a gaming console, a remote control device, a home automation controller, a domestic appliance (e.g., domestic temperature or lighting control system), a toy, a machine (e.g., a robot), an audio player, a video player, and a mobile telephone (e.g., a smartphone).

Figure 2:
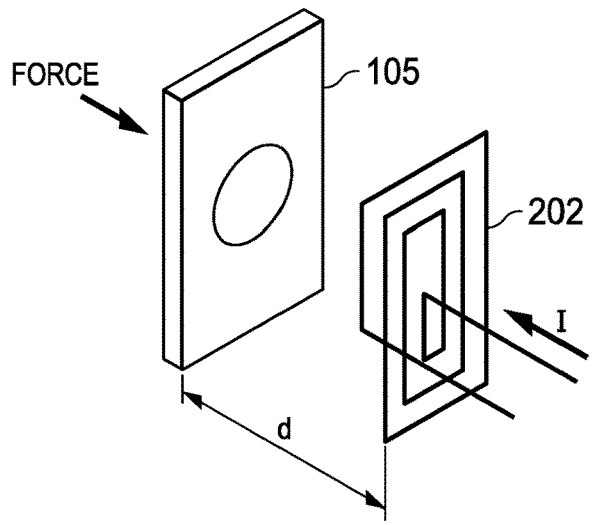
FIG. 2 illustrates a mechanical member separated by a distance from an inductive coil, in accordance with embodiments of the present disclosure.
Figure 3:
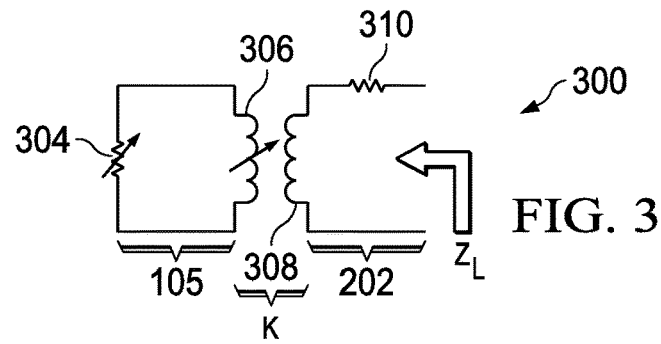
FIG. 3 illustrates selected components of a model for a mechanical member and inductive coil that may be used in an inductive sensing system, in accordance with embodiments of the present disclosure.

FIG. 2 illustrates mechanical member 105 embodied as a metal plate separated by a distance d from an inductive coil 202, in accordance with embodiments of the present disclosure. FIG. 3 illustrates selected components of a model for mechanical member 105 and inductive coil 202 that may be used in an inductive sensing system 300, in accordance with embodiments of the present disclosure. As shown in FIG. 3, inductive sensing system 300 may include mechanical member 105, modeled as a variable electrical resistance 304 and a variable electrical inductance 306, and may include inductive coil 202 in physical proximity to mechanical member 105 such that inductive coil 202 has a mutual inductance with mechanical member 105 defined by a variable coupling coefficient k. As shown in FIG. 3, inductive coil 202 may be modeled as a variable electrical inductance 308 and a variable electrical resistance 310. In operation, as a current I flows through inductive coil 202, such current may induce a magnetic field which in turn may induce an eddy current inside mechanical member 105. When a force is applied to and/or removed from mechanical member 105, which alters distance d between mechanical member 105 and inductive coil 202, the coupling coefficient k, variable electrical resistance 304, and/or variable electrical inductance 306 may also change in response to the change in distance. These changes in the various electrical parameters may, in turn, modify an effective impedance $Z_L$ of inductive coil 202.

Figure 4:
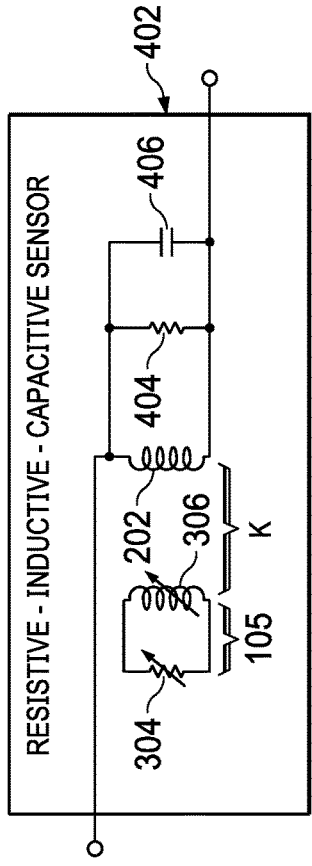
FIG. 4 illustrates selected components of an example resistive-inductive-capacitive sensor, in accordance with embodiments of the present disclosure.

FIG. 4 illustrates selected components of an example resistive-inductive-capacitive sensor 402, in accordance with embodiments of the present disclosure. As shown in FIG. 4, resistive-inductive-capacitive sensor 402 may include mechanical member 105, inductive coil 202, a resistor 404, and capacitor 406, wherein mechanical member 105 and inductive coil 202 have a variable coupling coefficient k. Although shown in FIG. 4 to be arranged in parallel with one another, it is understood that inductive coil 202, resistor 404, and capacitor 406 may be arranged in any other suitable manner that allows resistive-inductive-capacitive sensor 402 to act as a resonant tank. For example, in some embodiments, inductive coil 202, resistor 404, and capacitor 406 may be arranged in series with one another. In some embodiments, resistor 404 may not be implemented with a stand-alone resistor, but may instead be implemented by a parasitic resistance of inductive coil 202, a parasitic resistance of capacitor 406, and/or any other suitable parasitic resistance.

FIG. 5A illustrates a diagram of selected components of an example resonant phase sensing system 112A, in accordance with embodiments of the present disclosure. In some embodiments, resonant phase sensing system 112A may be used to implement resonant phase sensing system 112 of FIG. 1. As shown FIG. 5A, resonant phase sensing system 112A may include a resistive-inductive-capacitive sensor 402, a dummy impedance 502, switches 504 and 506, and a processing integrated circuit (IC) 512A.

Although not explicitly shown in FIG. 5A for purposes of clarity and exposition, switches 504 and 506 may be controlled by control signals communicated from phase compensator 552, as is described in greater detail below. Selective enabling and disabling of switches 504 and 506 may allow operation in at least two modes of operation. In a first or normal mode of operation, switches 504 may be enabled (e.g., activated, closed, turned on) and switches 506 may be disabled (e.g., deactivated, opened, turned off) such that V-I converter 508 drives resistive-inductive-capacitive sensor 402 as described in greater detail below. In a second or phase compensation mode of operation, switches 506 may be enabled (e.g., activated, closed, turned on) and switches 504 may be disabled (e.g., deactivated, opened, turned off) such that V-I converter 508 drives dummy impedance 502 as described in greater detail below.

Processing IC 512A may be communicatively coupled to resistive-inductive-capacitive sensor 402 and may comprise any suitable system, device, or apparatus configured to implement a measurement circuit to measure phase information associated with resistive-inductive-capacitive sensor 402 and based on the phase information, determine a displacement of mechanical member 105 relative to resistive-inductive-capacitive sensor 402. Thus, processing IC 512A may be configured to determine an occurrence of a physical interaction (e.g., press or release of a virtual button) associated with a human-machine interface associated with mechanical member 105 based on the phase information.

As shown in FIG. 5A, processing IC 512A may include a phase shifter 510, a voltage-to-current (V-I) converter 508, a preamplifier 540, an intermediate frequency mixer 542, a combiner 544, a programmable gain amplifier (PGA) 514, an oscillator 516, a phase shifter 518, an amplitude and phase calculation block 531, a DSP 532, a low-pass filter 534, a combiner 550, and a phase compensator 552. Processing IC 512A may also include a coherent incident/quadrature detector implemented with an incident channel comprising a mixer 520, a low-pass filter 524, and an analog-to-digital converter (ADC) 528, and a quadrature channel comprising a mixer 522, a low-pass filter 526, and an ADC 530 such that processing IC 512A is configured to measure the phase information using the coherent incident/quadrature detector.

Phase shifter 510 may include any system, device, or apparatus configured to receive an oscillation signal generated by processing IC 512A (as explained in greater detail below) and phase shift such oscillation signal such that at an operating frequency of resonant phase sensing system 112, an incident component of a sensor signal $\phi$ generated by pre-amplifier 540 is approximately equal to a quadrature component of sensor signal $\phi$, so as to provide common mode noise rejection by a phase detector implemented by processing IC 512A, as described in greater detail below.

V-I converter 508 may receive the phase shifted oscillation signal from phase shifter 510, which may be a voltage signal, convert the voltage signal to a corresponding current signal, and drive the current signal on resistive-inductive-capacitive sensor 402 (or dummy impedance 502) at a driving frequency with the phase-shifted oscillation signal in order to generate sensor signal $\phi$ which may be processed by processing IC 512A, as described in greater detail below. In some embodiments, a driving frequency of the phase-shifted oscillation signal may be selected based on a resonant frequency of resistive-inductive-capacitive sensor 402 (e.g., may be approximately equal to the resonant frequency of resistive-inductive-capacitive sensor 402).

Preamplifier 540 may receive sensor signal $\phi$ and condition sensor signal $\phi$ for frequency mixing, with mixer 542, to an intermediate frequency $\Delta f$ combined by combiner 544 with an oscillation frequency generated by oscillator 516, as described in greater detail below, wherein intermediate frequency $\Delta f$ is significantly less than the oscillation frequency. In some embodiments, preamplifier 540, mixer 542, and combiner 544 may not be present, in which case PGA 514 may receive sensor signal $\phi$ directly from resistive-inductive-capacitive sensor 402. However, when present, preamplifier 540, mixer 542, and combiner 544 may allow for mixing sensor signal $\phi$ down to a lower intermediate frequency $\Delta f$ which may allow for lower-bandwidth and more efficient ADCs (e.g., ADCs 528 and 530 of FIGS. 5A and 5B and ADC 529 of FIG. 5C, described below) and/or which may allow for minimization of phase and/or gain mismatches in the incident and quadrature paths of the phase detector of processing IC 512A.

In operation, PGA 514 may further amplify sensor signal $\phi$ to condition sensor signal $\phi$ for processing by the coherent incident/quadrature detector. Oscillator 516 may generate an oscillation signal to be used as a basis for the signal driven by V-I converter 508, as well as the oscillation signals used by mixers 520 and 522 to extract incident and quadrature components of amplified sensor signal $\phi$. As shown in FIG. 5A, mixer 520 of the incident channel may use an unshifted version of the oscillation signal generated by oscillator 516, while mixer 522 of the quadrature channel may use a 90-degree shifted version of the oscillation signal phase shifted by phase shifter 518. As mentioned above, the oscillation frequency of the oscillation signal generated by oscillator 516 may be selected based on a resonant frequency of resistive-inductive-capacitive sensor 402 (e.g., may be approximately equal to the resonant frequency of resistive-inductive-capacitive sensor 402). In some embodiments, oscillator 516 may be implemented with a voltage-controlled oscillator (VCO). In other embodiments, oscillator 516 may be implemented with a digitally-controlled oscillator (DCO).

In the incident channel, mixer 520 may extract the incident component of amplified sensor signal $\phi$, low-pass filter 524 may filter out the oscillation signal mixed with the amplified sensor signal $\phi$ to generate a direct current (DC) incident component, and ADC 528 may convert such DC incident component into an equivalent incident component digital signal for processing by amplitude and phase calculation block 531. Similarly, in the quadrature channel, mixer 522 may extract the quadrature component of amplified sensor signal $\phi$, low-pass filter 526 may filter out the phase-shifted oscillation signal mixed with the amplified sensor signal $\phi$ to generate a direct current (DC) quadrature component, and ADC 530 may convert such DC quadrature component into an equivalent quadrature component digital signal for processing by amplitude and phase calculation block 531.

Amplitude and phase calculation block 531 may include any system, device, or apparatus configured to receive phase information comprising the incident component digital signal and the quadrature component digital signal and based thereon, extract amplitude and phase information.

DSP 532 may include any system, device, or apparatus configured to interpret and/or execute program instructions and/or process data. In particular, DSP 532 may receive the phase information and the amplitude information generated by amplitude and phase calculation block 531 and based thereon, determine a displacement of mechanical member 105 relative to resistive-inductive-capacitive sensor 402, which may be indicative of an occurrence of a physical interaction (e.g., press or release of a virtual button or other interaction with a virtual interface) associated with a human-machine interface associated with mechanical member 105 based on the phase information. DSP 532 may also generate an output signal indicative of the displacement. In some embodiments, such output signal may comprise a control signal for controlling mechanical vibration of linear resonant actuator 107 in response to the displacement.

In the first or normal mode of operation, phase compensator 552 may, based on a previously-determined phase compensation calculated during a previous phase compensation mode of operation, apply such phase compensation to phase information and/or displacement information generated by DSP 532. In the second or phase compensation mode of operation, phase compensator 552 may determine a phase compensation to be applied to measurements of phase information and/or displacement information, as described in greater detail below.

Combiner 550 may subtract the phase information generated by amplitude and phase calculation block 531 and compensated by phase compensator 552 from a reference phase $\phi_{ref}$ in order to generate an error signal that may be received by low-pass filter 534. Low-pass filter 534 may low-pass filter the error signal, and such filtered error signal may be applied to oscillator 516 to modify the frequency of the oscillation signal generated by oscillator 516, in order to drive sensor signal $\phi$ towards reference phase $\phi_{ref}$. As a result, sensor signal $\phi$ may comprise a transient decaying signal in response to a "press" of a virtual button (or other interaction with a virtual interface) associated with resonant phase sensing system 112A as well as another transient decaying signal in response to a subsequent "release" of the virtual button (or other interaction with a virtual interface). Accordingly, low-pass filter 534 in connection with oscillator 516 may implement a feedback control loop that may track changes in operating parameters of resonant phase sensing system 112A by modifying the driving frequency of oscillator 516.

FIG. 5B illustrates a diagram of selected components of an example resonant phase sensing system 112B, in accordance with embodiments of the present disclosure. In some embodiments, resonant phase sensing system 112B may be used to implement resonant phase sensing system 112 of FIG. 1. Resonant phase sensing system 112B of FIG. 5B may be, in many respects, similar to resonant phase sensing system 112A of FIG. 5A. Accordingly, only those differences between resonant phase sensing system 112B and resonant phase sensing system 112A may be described below. As shown FIG. 5B, resonant phase sensing system 112B may include processing IC 512B in lieu of processing IC 512A. Processing IC 512B of FIG. 5B may be, in many respects, similar to processing IC 512A of FIG. 5A. Accordingly, only those differences between processing IC 512B and processing IC 512A may be described below.

Processing IC 512B may include variable phase shifter 519. Thus, in operation, oscillator 516 may drive a driving signal and oscillation signal which variable phase shifter 519 may phase shift to generate oscillation signals to be mixed by mixers 520 and 522. Similar to that of processing IC 512A, low-pass filter 534 may low-pass filter an error signal based on phase information extracted by amplitude and phase calculation block 531, but instead such filtered error signal may be applied to variable phase shifter 519 to modify the phase offset of the oscillation signal generated by oscillator 516, in order to drive sensor signal $\phi$ towards indicating a phase shift of zero. As a result, sensor signal $\phi$ may comprise a transient decaying signal in response to a "press" of a virtual button (or other interaction with a virtual interface) associated with resonant phase sensing system 112B as well as another transient decaying signal in response to a subsequent "release" of the virtual button (or other interaction with a virtual interface). Accordingly, low-pass filter 534 in connection with variable phase shifter 519 may implement a feedback control loop that may track changes in operating parameters of resonant phase sensing system 112B by modifying the phase shift applied by variable phase shifter 519.

FIG. 5C illustrates a diagram of selected components of an example resonant phase sensing system 112C, in accordance with embodiments of the present disclosure. In some embodiments, resonant phase sensing system 112C may be used to implement resonant phase sensing system 112 of FIG. 1. Resonant phase sensing system 112C of FIG. 5C may be, in many respects, similar to resonant phase sensing system 112A of FIG. 5A. Accordingly, only those differences between resonant phase sensing system 112C and resonant phase sensing system 112A may be described below. For example, a particular difference between resonant phase sensing system 112C and resonant phase sensing system 112A is that resonant phase sensing system 112C may include ADC 529 and ADC 541 in lieu of ADC 528 and ADC 530. Accordingly, a coherent incident/quadrature detector for resonant phase sensing system 112C may be implemented with an incident channel comprising a digital mixer 521 and a digital low-pass filter 525 (in lieu of analog mixer 520 and analog low-pass filter 524) and a quadrature channel comprising a digital mixer 523 and a low-pass filter 527 (in lieu of analog mixer 522 and analog low-pass filter 526) such that processing IC 512C is configured to measure the phase information using such coherent incident/quadrature detector. Although not explicitly shown, resonant phase sensing system 112B could be modified in a manner similar to that of how resonant phase sensing system 112A is shown to be modified to result in resonant phase sensing system 112C.

FIG. 6A illustrates a diagram of selected components of an example dummy impedance 502A, in accordance with embodiments of the present disclosure. In some embodiments, dummy impedance 502A may be used to implement dummy impedance 502 depicted in FIGS. 5A-5C. As shown in FIG. 6A, dummy impedance 502A may include a resistor 602. In some embodiments, a resistance of resistor 602 may be selected to approximately match a resistance of resistor 404 of resistive-inductive-capacitive sensor 402.

FIG. 6B illustrates a diagram of selected components of an example dummy impedance 502B, in accordance with embodiments of the present disclosure. In some embodiments, dummy impedance 502B may be used to implement dummy impedance 502 depicted in FIGS. 5A-5C. As shown in FIG. 6B, dummy impedance 502B may include a resistor 602 coupled to a capacitor 604. Although FIG. 6B depicts a resistor 602 in parallel with capacitor 604, in some embodiments, dummy impedance 502B may include resistor 602 in series with capacitor 604. Furthermore, although FIG. 6B depicts a first-order impedance with a single resistor 602 in parallel with a single capacitor 604, in some embodiments, dummy impedance 502B may include a higher-order impedance having multiple resistors 602 and/or multiple capacitors 604 arranged in any suitable manner. In some embodiments, an overall complex impedance of dummy impedance 502B may be selected to approximately match a complex impedance of resistive-inductive-capacitive sensor 402.

Under normal operation (e.g., in the normal or first mode of operation), phase compensator 552 may enable switches 504 and disable switches 506, such that resistive-inductive-capacitive sensor 402 is coupled to (and dummy impedance 502 is decoupled from) processing IC 512B and V-I converter 508 drives resistive-inductive-capacitive sensor 402. In such mode of operation, resonant phase sensing system 112 may measure phase information $\phi_{sensor}$ using resistive-inductive-capacitive sensor 402.

However, in response to a condition for entering the phase compensation mode, resonant phase sensing system 112 may enter the phase compensation or second mode of operation, and phase compensator 552 may enable switches 506 and disable switches 504, such that dummy impedance 502 is coupled to (and resistive-inductive-capacitive sensor 402 is decoupled from) processing IC 512B and V-I converter 508 drives dummy impedance 502. A condition for entering the phase compensation mode may include any suitable condition. For example, phase compensation information $\phi_{comp}$ measured during a prior phase compensation mode (as described in detail below) may no longer be "valid" or useful if an operating frequency or resonance of resistive-inductive-capacitive sensor 402 varies or if a temperature associated with resistive-inductive-capacitive sensor 402 varies. Thus, one condition for entering the phase compensation mode may be the operating frequency or resonance of resistive-inductive-capacitive sensor 402 varying by more than a threshold amount and/or the temperature associated with resistive-inductive-capacitive sensor 402 varying more than a threshold amount. Another condition for entering the phase compensation mode may be a change or drift in driving frequency of oscillator 516 by more than a threshold amount. Yet another condition for entering the phase compensation mode may be a passage of time, such that phase compensator 552 periodically determines new values for phase compensation information $\phi_{comp}$. Another condition for entering the phase compensation mode may include an on demand request from a component of resonant phase sensing system 112 or mobile device 102 to calculate phase compensation information $\phi_{comp}$. Yet another condition for entering the phase compensation mode may include a change in a supply voltage of resonant phase sensing system 112 by more than a threshold amount.

In the phase compensation or second mode of operation, all processing circuitry and parameters of resonant phase sensing system 112 may remain unchanged from the phase measurement taken during the normal or first mode of operation. Phase compensator 552 may, during the phase compensation mode, measure phase compensation information $\phi_{comp}$ using dummy impedance 502 and store such phase compensation information $\phi_{comp}$.

Such phase compensation information $\phi_{comp}$ may be indicative of a phase shift induced by all processing blocks of resonant phase sensing system 112 other than resistive-inductive-capacitive sensor 402, particularly in embodiments where dummy impedance 502 includes only resistance (as in dummy impedance 502A of FIG. 6A), as resistance by definition introduces zero phase shift regardless of temperature and frequency.

In embodiments where dummy impedance 502 has a complex resistive plus capacitive impedance (as in dummy impedance 502B of FIG. 6B), the values of the resistance and capacitance of dummy impedance 502 may be periodically calibrated to create a pole at a desired frequency, wherein such desired frequency may be selected such that the phase of dummy impedance 502 varies with frequency in a band around a carrier frequency. Thus, a resistive-capacitive dummy impedance 502 may introduce a known phase shift if the driving frequency of oscillator 516 is varied. Thus, when a resistive-capacitive dummy impedance 502 is used, phase compensation information $\phi_{comp}$ may be indicative of a phase shift induced by all processing blocks of resonant phase sensing system 112 other than resistive-inductive-capacitive sensor 402, including any drift in driving frequency of oscillator 516.

Accordingly, when resonant phase sensing system 112 reenters the normal mode of operation, phase compensator 552 may use the stored phase compensation information $\phi_{comp}$ and the phase information $\phi_{sensor}$ measured during the normal mode in order to determine a phase shift caused by resistive-inductive-capacitive sensor 402 alone, which may be indicative of a displacement associated with resistive-inductive-capacitive sensor 402. In some embodiments, phase compensator 552 may determine the phase shift caused by resistive-inductive-capacitive sensor 402 alone by mathematical subtraction of phase compensation information $\phi_{comp}$ from measured phase information $\phi_{sensor}$. In other embodiments, phase compensator 552 may determine the phase shift caused by resistive-inductive-capacitive sensor 402 alone by more complex processing, such as computing mean values, standard deviation values, common-mode values, and/or difference-mode values. In these and other embodiments, phase compensator 552 may determine the phase shift caused by resistive-inductive-capacitive sensor 402 alone by analyzing temporal characteristics of phase compensation information $\phi_{comp}$ and measured phase information $\phi_{sensor}$, and compensating for differences between phase compensation information $\phi_{comp}$ and measured phase information $\phi_{sensor}$. Further, in these and other embodiments, phase compensator 552 may be used within a control loop wherein phase compensator 552 may process phase measurements in both the normal and phase compensation modes of operation and used to provide a control signal to oscillator 516 in order to minimize frequency drift of oscillator 516.

It is understood that embodiments of a resonant phase sensing system 112 may provide for both use of a resistive dummy impedance 502A and a resistive-capacitive dummy impedance 502B. For example, in some embodiments, a resonant phase sensing system 112 may include a resistive dummy impedance 502A and a separate capacitive dummy impedance (e.g., similar to dummy impedance 502B but without resistor 602) and an associated switching network of switches similar to switches 504 and 506, wherein such switching network may be controlled by phase compensator 552 to selectively switch such resistive dummy impedance and capacitive dummy impedance in and out of resonant phase sensing system 112 to enable time-division multiplexed implementation of both a resistive dummy impedance (e.g., resistive dummy impedance enabled and capacitive dummy impedance disabled) and a resistive-capacitive dummy impedance (e.g., resistive dummy impedance enabled and capacitive dummy impedance enabled).

Thus, in some embodiments, at least three modes of operation may exist:
a first phase compensation mode in which resistive-inductive-capacitive sensor 402 is disabled, resistive dummy impedance is enabled, capacitive dummy impedance is disabled, and phase compensator 552 may measure first phase compensation information $\phi_{compR}$ using the resistive dummy impedance;
a second phase compensation mode in which resistive-inductive-capacitive sensor 402 is disabled, resistive dummy impedance is enabled, capacitive dummy impedance is enabled, and phase compensator 552 may measure second phase compensation information $\phi_{compRC}$ using the combined resistive-capacitive dummy impedance; and
a normal mode in which resistive-inductive-capacitive sensor 402 is enabled, resistive dummy impedance is disabled, capacitive dummy impedance is disabled, and phase compensator 552 may measure phase information $\phi_{sensor}$ using resistive-inductive-capacitive sensor 402.

From these three phases of operation, phase compensator 552 may be able to determine:
based on first phase compensation information $\phi_{compR}$ and second phase compensation information $\phi_{compRC}$, an amount of phase shift induced by oscillator 516 alone; and
based on first phase compensation information $\phi_{compR}$, second phase compensation information $\phi_{compRC}$, and measured phase information $\phi_{sensor}$, an amount of phase shift induced by resistive-inductive-capacitive sensor 402.

In other embodiments, resonant phase sensing system 112 may implement dummy impedance 502 as a parallel processing path with its own driver (e.g., V-I converter 508) and amplifier subsystem (e.g., PGA 514). Thus, instead of switching between resistive-inductive-capacitive sensor 402 and dummy impedance 502, the parallel path may operate concurrently or sequentially with the sensor path to extract the appropriate phase compensation information.

Although as depicted above switches 504 and 506 may functionally achieve a goal of selectively coupling and decoupling resistive-inductive-capacitive sensor 402 and dummy impedance 502 from the remainder of resonant phase sensing system 112, one or more other configurations may be used including, without limitation:

- switches used to drive current generated by V-I converter 508 to dummy impedance 502;
- duplication of V-I converter 508 to drive dummy impedance 502 which is coupled to the amplifier subsystem of resonant phase sensing system 112;
- dummy impedance is arranged in series with resistive-inductive-capacitive sensor 402 and is coupled to the amplifier subsystem of resonant phase sensing system 112; and
- both duplication of V-I converter 508 and the amplifier subsystem of resonant phase sensing system 112 are duplicated for driving and sensing resistive-inductive-capacitive sensor 402 and dummy impedance 502.

In these and other embodiments, when phase information is measured using dummy impedance 502 one or more components of resonant phase sensing system 112 may be bypassed. For example, when a phase measurement with dummy impedance 502 is taken with a component (e.g., amplifier subsystem) enabled and another phase measurement with dummy impedance 502 is taken with such component bypassed, the phase behavior of such component may be determined based on such phase measurements.

Although the foregoing contemplates use of closed-loop feedback for sensing of displacement, the various embodiments represented by FIGS. 5A-5C may be modified to implement an open-loop system for sensing of displacement. In such an open-loop system, a processing IC may include no feedback path from amplitude and phase calculation block 531 to oscillator 516 or variable phase shifter 519 and thus may also lack a feedback low-pass filter 534. Thus, a phase measurement may still be made by comparing a change in phase to a reference phase value, but the oscillation frequency driven by oscillator 516 may not be modified or the phase shifted by variable phase shifter 519 may not be shifted.

Although the foregoing contemplates use of a coherent incident/quadrature detector as a phase detector for determining phase information associated with resistive-inductive-capacitive sensor 402, a resonant phase sensing system 112 may perform phase detection and/or otherwise determine phase information associated with resistive-inductive-capacitive sensor 402 in any suitable manner, including, without limitation, using only one of the incident path or quadrature path to determine phase information.

In some embodiments, an incident/quadrature detector as disclosed herein may include one or more frequency translation stages that translate the sensor signal into direct-current signal directly or into an intermediate frequency signal and then into a direct-current signal. Any of such frequency translation stages may be implemented either digitally after an analog-to-digital converter stage or in analog before an analog-to-digital converter stage.

In addition, although the foregoing contemplates measuring changes in resistance and inductance in resistive-inductive-capacitive sensor 402 caused by displacement of mechanical member 105, other embodiments may operate based on a principle that any change in impedance based on displacement of mechanical member 105 may be used to sense displacement. For example, in some embodiments, displacement of mechanical member 105 may cause a change in a capacitance of resistive-inductive-capacitive sensor 402, such as if mechanical member 105 included a metal plate implementing one of the capacitive plates of capacitor 406.

Although DSP 532 may be capable of processing phase information to make a binary determination of whether physical interaction associated with a human-machine interface associated with mechanical member 105 has occurred and/or ceased to occur, in some embodiments, DSP 532 may quantify a duration of a displacement of mechanical member 105 to more than one detection threshold, for example to detect different types of physical interactions (e.g., a short press of a virtual button versus a long press of the virtual button). In these and other embodiments, DSP 532 may quantify a magnitude of the displacement to more than one detection threshold, for example to detect different types of physical interactions (e.g., a light press of a virtual button versus a quick and hard press of the virtual button).

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. A system comprising:
   a sensor having a variable phase response;
   a dummy impedance having a known phase response; and
   a measurement circuit communicatively coupled to the sensor and configured to:
      drive the sensor with a current-mode driving signal;
      measure a first voltage output by the sensor in response to the current-mode driving signal;
      determine first phase information associated with the sensor based on the first voltage using a coherent incident/quadrature detector;
      drive the dummy impedance with the current-mode driving signal;
      measure a second voltage output by the dummy impedance in response to the current-mode driving signal;
      determine second phase information associated with the dummy impedance based on the second voltage using the coherent incident/quadrature detector; and
      determine a phase response of the measurement circuit based on a comparison of the first phase information to the second phase information.

2. The system of claim 1, wherein the measurement circuit is configured to:
   measure the first phase information by coupling the sensor to the measurement circuit and decoupling the dummy impedance from the measurement circuit; and
   measure the second phase information by decoupling the sensor from the measurement circuit and coupling the dummy impedance to the measurement circuit.

3. The system of claim 2, further comprising a switching network configured to:
   selectively couple and decouple the sensor from the measurement circuit; and
   selectively couple and decouple the dummy impedance from the measurement circuit.

4. The system of claim 1, wherein the sensor is a resistive-inductive-capacitive sensor.

5. The system of claim 4, wherein:
   the system further comprises a driver configured to drive the sensor at a driving frequency; and
   the measurement circuit is configured to, based on the first phase information, determine a displacement of a mechanical member relative to the resistive-inductive-capacitive sensor, wherein the displacement of the mechanical member causes a change in an impedance of the resistive-inductive-capacitive sensor.

6. The system of claim 5, wherein the measurement circuit is further configured to apply compensation to the determination of the displacement based on the phase response of the measurement circuit.

7. The system of claim 1, wherein the measurement circuit is further configured to apply compensation to the first phase information based on the phase response of the measurement circuit.

8. The system of claim 4, further comprising:
   a driver configured to drive the resistive-inductive-capacitive sensor and drive the dummy impedance at a driving frequency; and
   a switching network configured to selectively couple and decouple the dummy impedance from the driver.

9. The system of claim 1, wherein the sensor, the dummy impedance, and the measurement circuit are arranged such that the measurement circuit measures the first phase information in parallel with measurement of the second phase information.

10. The system of claim 4, further comprising:
    a first driver configured to drive the resistive-inductive-capacitive sensor at a driving frequency; and
    a second driver configured to drive the dummy impedance at the driving frequency.

11. The system of claim 1, wherein the dummy impedance comprises a resistor.

12. The system of claim 11, wherein the dummy impedance further comprises a capacitor coupled to the resistor.

13. The system of claim 12, wherein an impedance of the dummy impedance is selected to create a pole in the known phase response at a desired frequency.

14. The system of claim 12, wherein an impedance of the dummy impedance is selected to create a known phase shift for frequencies approximate to a driving frequency at which the sensor and the dummy impedance are driven.

15. The system of claim 1, wherein the phase response of the measurement circuit is based on at least one of:
    a mathematical difference between the first phase information and the second phase information; and
    a comparison of temporal characteristics between the first phase information and the second phase information.

16. The system of claim 1, wherein the measurement circuit is configured to measure the second phase information associated with the dummy impedance and determine the phase response of the measurement circuit responsive to a condition for performing phase compensation.

17. The system of claim 16, wherein the condition for performing phase compensation comprises at least one of:
    an operating frequency or resonance of the sensor varying by more than a threshold frequency amount;
    a temperature associated with the sensor varying more than a threshold temperature amount;
    a change in a driving frequency of a driving signal for the sensor varying by more than a threshold driving frequency amount;
    a passage of a duration of time;
    an on-demand request from a component of the system; and a change in a supply voltage of the system by more than a threshold voltage amount.

18. A method comprising, in a system including a sensor having a variable phase response, a dummy impedance having a known phase response, and a measurement circuit for measuring phase information associated with the sensor:
driving the sensor with a current-mode driving signal;
measuring a first voltage output by the sensor in response to the current-mode driving signal;
determining first phase information associated with the sensor based on the first voltage using a coherent incident/quadrature detector;
driving the dummy impedance with the current-mode driving signal;
measuring a second voltage output by the dummy impedance in response to the current-mode driving signal;
determining second phase information associated with the dummy impedance based on the second voltage using the coherent incident/quadrature detector; and
determining a phase response of the measurement circuit based on a comparison of the first phase information to the second phase information.

19. The method of claim 18, further comprising:
measuring the first phase information by coupling the sensor to the measurement circuit and decoupling the dummy impedance from the measurement circuit; and
measuring the second phase information by decoupling the sensor from the measurement circuit and coupling the dummy impedance to the measurement circuit.

20. The method of claim 19, further comprising:
selectively coupling and decoupling the sensor from the measurement circuit; and
selectively coupling and decoupling the dummy impedance from the measurement circuit.

21. The method of claim 18, wherein the sensor is a resistive-inductive-capacitive sensor.

22. The method of claim 21, wherein the system further comprises a driver configured to drive the sensor at a driving frequency and the method further comprises, based on the first phase information, determining a displacement of a mechanical member relative to the resistive-inductive-capacitive sensor, wherein the displacement of the mechanical member causes a change in an impedance of the resistive-inductive-capacitive sensor.

23. The method of claim 22, further comprising applying compensation to the determination of the displacement based on the phase response of the measurement circuit.

24. The method of claim 18, further comprising applying compensation to the first phase information based on the phase response of the measurement circuit.

25. The method of claim 21, further comprising:
driving the resistive-inductive-capacitive sensor and drive the dummy impedance at a driving frequency; and
selectively coupling and decoupling the dummy impedance from the driver.

26. The method of claim 18, further comprising measuring the first phase information in parallel with measurement of the second phase information.

27. The method of claim 21, further comprising:
driving the resistive-inductive-capacitive sensor at a driving frequency; and
driving the dummy impedance at the driving frequency.

28. The method of claim 18, wherein the dummy impedance comprises a resistor.

29. The method of claim 28, wherein the dummy impedance further comprises a capacitor coupled to the resistor.

30. The method of claim 29, wherein a impedance of the dummy impedance is selected to create a pole in the known phase response at a desired frequency.

31. The method of claim 29, wherein a impedance of the dummy impedance is selected to create a known phase shift for frequencies approximate to a driving frequency at which the sensor and the dummy impedance are driven.

32. The method of claim 18, wherein the phase response of the measurement circuit is based on at least one of:
a mathematical difference between the first phase information and the second phase information; and
a comparison of temporal characteristics between the first phase information and the second phase information.

33. The method of claim 18, further comprising measuring the second phase information associated with the dummy impedance and determining the phase response of the measurement circuit responsive to a condition for performing phase compensation.

34. The method of claim 33, wherein the condition for performing phase compensation comprises at least one of:
an operating frequency or resonance of the sensor varying by more than a threshold frequency amount;
a temperature associated with the sensor varying more than a threshold temperature amount;
a change in a driving frequency of a driving signal for the sensor varying by more than a threshold driving frequency amount;
a passage of a duration of time;
an on-demand request from a component of the system; and
a change in a supply voltage of the system by more than a threshold voltage amount.

* * * * *